United States Patent [19]
Shahar et al.

[11] Patent Number: 5,905,264
[45] Date of Patent: May 18, 1999

[54] SEMICONDUCTOR DETECTOR

[75] Inventors: Arie Shahar, Moshav Magshimim; Uri El-Hanany, Rehovot; Alex Tsigelman, Petach Tikva; Alex Gorin, Rishon Le Zion; Shimon Klier, Savion; Eldan Halbertal, Moshav Beit Zait, all of Israel

[73] Assignee: Imarad Imaging Systems Ltd., Rehovot, Israel

[21] Appl. No.: 08/905,644

[22] Filed: Aug. 4, 1997

[30] Foreign Application Priority Data

Aug. 14, 1996 [IL] Israel ............................... 119075

[51] Int. Cl.$^6$ ............................... H01L 31/00; G01T 1/24
[52] U.S. Cl. ............................... 250/370.01; 250/371
[58] Field of Search ............................... 250/371, 370.01

[56] References Cited

U.S. PATENT DOCUMENTS

| | | |
|---|---|---|
| 4,594,583 | 6/1986 | Seko et al. . |
| 4,604,611 | 8/1986 | Seko et al. . |
| 4,795,909 | 1/1989 | Dibianca ............... 250/385.1 |
| 4,926,228 | 5/1990 | Ashley et al. . |
| 4,996,432 | 2/1991 | Saitou ............... 250/370.01 |
| 5,326,996 | 7/1994 | McNutt . |
| 5,365,069 | 11/1994 | Eisen et al. . |
| 5,677,539 | 10/1997 | Apotovsky et al. ............... 250/370.13 |

FOREIGN PATENT DOCUMENTS

| | | |
|---|---|---|
| 33 21 921 | 12/1984 | Germany . |
| 57-201086 | 12/1982 | Japan . |
| 60-218870 | 11/1985 | Japan . |
| WO 97/14060 | 4/1997 | WIPO . |

OTHER PUBLICATIONS

P.N. Lake, Unipolar Charge Sensing With Coplanar Electrodes–Application to Semiconductor Detectors, Conference Proceedings, IEEE Symposium—Norfolk, Va. Oct. 1994, pp. 1–7.

*Primary Examiner*—Constantine Hannaher
*Attorney, Agent, or Firm*—Helfgott & Karas, P.C.

[57] ABSTRACT

A semiconductive detector includes a semiconductor substrate having electrodes formed at two opposite-facing surfaces thereof. A peripheral side-wall extends between the two opposite facing-surfaces, and an electrical insulator is formed on at least a portion of the side wall. An electrical conductor is provided over the insulator. A bias voltage may be applied to the conductor such that the electrical insulator and the conductor operate generally in a manner of a field effect transistor.

14 Claims, 5 Drawing Sheets

FIG. 2
(PRIOR ART)

SEMICONDUCTOR DETECTOR

FIELD OF THE INVENTION

The present invention relates generally to radiation detectors and more particularly to arrays of modular detector assemblies employed for Gamma Ray and X-Ray imaging.

BACKGROUND OF THE INVENTION

Various types of semiconductor detectors are known in the art. As will be described hereinbelow with reference to the drawings, conventional semiconductor detectors suffer from performance degradation inter alia due to non-uniformities in the electric field thereacross adjacent the side walls thereof and leakage current along the surface of the detector side walls.

The following U.S. and foreign patent documents show the provision of an external electrode for various purposes distinct and different from those of the present invention: U.S. Pat. Nos. 5,326,996; 4,926,228; Japanese Kokais 60-218870 and 57-201086 and German Offenlegungsschrift DE 3321921.

SUMMARY OF THE INVENTION

The present invention seeks to provide a semiconductor detector and an array of modular detector assemblies which overcome performance degradation due to non-uniformities in the electric field thereacross adjacent the side walls thereof, recombination and traps for charge carriers and leakage current along the surface of the detector side walls.

The present invention seeks to provide semiconductor detectors having reduced charge carrier recombination and trapping and reduced leakage current adjacent the side walls thereof for improving the charge collection efficiency, the signal to noise ratio and the energy resolution of the detectors.

There is thus provided in accordance with a preferred embodiment of the present invention a semiconductor detector including a substrate formed of a semiconductor material having electrodes formed on two opposite facing surfaces thereof and defining a peripheral side wall extending between the two opposite facing surfaces, the peripheral side wall having formed on at least a portion thereof an electrical insulator over which is provided an electrical conductor to which a bias voltage may be applied, such that the insulative layer and the conductor operate generally in the manner of a field-effect transistor.

There is also provided in accordance with a preferred embodiment of the present invention, an array of modular semiconductor detector assemblies, each detector assembly including a substrate formed of a semiconductor material having electrodes formed on two opposite facing surfaces thereof and defining a peripheral side wall extending between the two opposite facing surfaces, the peripheral side wall having formed on at least a portion thereof an electrical insulator over which is provided an electrical conductor to which a bias voltage may be applied, such that the insulative layer and the conductor operate generally in the manner of a field-effect transistor.

In accordance with a preferred embodiment of the present invention, peripheral side walls of adjacent detector assemblies have a common conductor functioning as a FET gate electrode. Alternatively, the peripheral side walls may be provided with separate conductors.

In accordance with a preferred embodiment of the present invention, the electrodes are floating and are electrically isolated from the electrical insulator and the electrical conductor.

Further in accordance with a preferred embodiment of the present invention, the electrodes, for any bias value and polarity thereof, induce an electric field through the electrical insulator into the semiconductor material, thereby pulling electrons from a region adjacent the at least one side wall towards the electrical insulator, and producing a space charge at a boundary between the electrical insulator and the at least one side wall, the space charge shifting trajectories of charge carriers away from the region adjacent the at least one side wall.

Still further in accordance with a preferred embodiment of the present invention, there is provided at least one anode and at least one cathode, wherein the electrode is substantially maintained at a potential relative to the at least one cathode, the potential being of the same polarity and less than an electrical potential substantially maintained between at the at least one anode and the at least one cathode.

There is also provided in accordance with a preferred embodiment of the present invention, a method for overcoming performance degradation in a semiconductor detector due to non-uniformities in an electric field adjacent a side wall, the detector comprising a substrate formed of a semiconductor material and defining two opposite facing surfaces and at least one side wall, and also comprising electrodes formed on two opposite facing surfaces of the substrate, the method comprising the steps of forming an electrical insulator on at least part of the at least one side wall, and forming an electrical conductor over at least part of the electrical insulator, wherein the electrodes, the insulative layer and the conductor operate generally in the manner of a field-effect transistor.

In accordance with a preferred embodiment of the present invention, the method further includes the step of inducing an electric field through the electrical insulator into the semiconductor material, thereby pulling electrons from a region adjacent the at least one side wall towards the electrical insulator, and producing a space charge at a boundary between the electrical insulator and the at least one side wall, the space charge shifting trajectories of charge carriers away from the region adjacent the at least one side wall.

BRIEF DESCRIPTION OF THE DRAWINGS

The present invention will be understood and appreciated more fully from the following detailed description in which:

FIG. 2 is a simplified illustration of a prior art detector plane formed of an array of modular detector assemblies;

DETAILED DESCRIPTION OF A PREFERRED EMBODIMENT

Figure 1A:
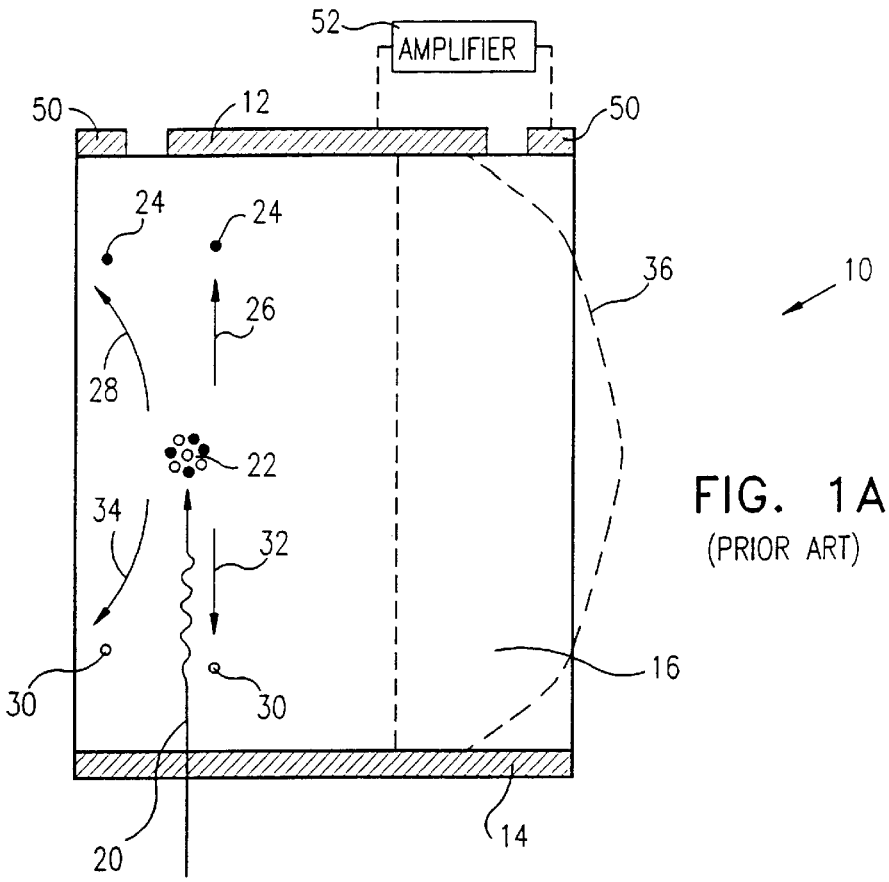
FIGS. 1A and 1B are respective side and top view simplified illustrations of a prior art semiconductor detector.
Figure 1B:
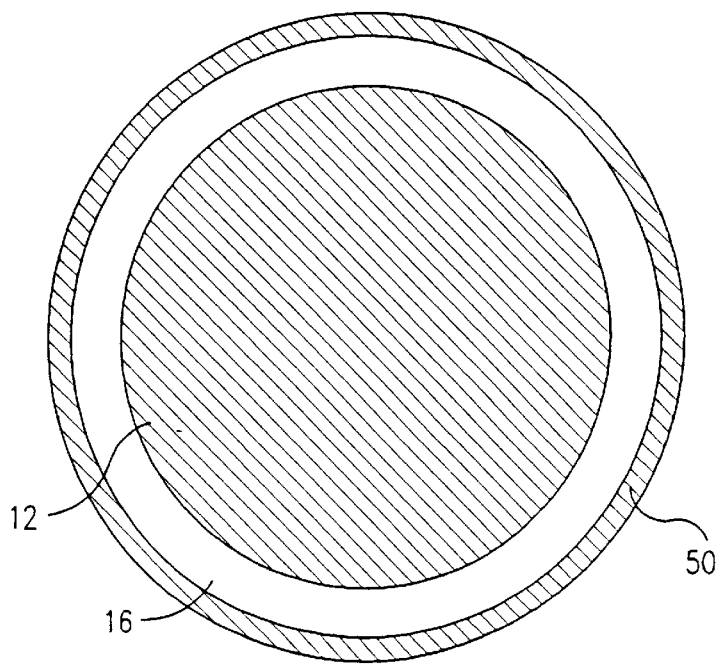

Reference is now made to FIGS. 1A and 1B which illustrate a prior art semiconductor detector 10. The detector 10 has two contact electrodes, including an anode 12 and a cathode 14 disposed along opposite surfaces of a semiconductor crystal substrate volume 16.

A photon 20 is shown inside the volume of detector 10. The presence of the photon produces a charge cloud 22 of electron-hole pairs. Due to the electric field produced in volume 16 by the anode 12 and the cathode 14, electrons 24 move from the cloud 22 towards the anode 12, typical electron trajectories being indicated by arrows 26 and 28. Similarly holes 30 move from the cloud 22 towards the cathode 14, typical hole trajectories being indicated by arrows 32 and 34.

It may be readily appreciated that the trajectories of the electrons and holes in the detector volume 16 are influenced by the intensity distribution of the electric field therein and the scattering of the charge carriers as they move toward the electrodes 12 and 14. Although the scattering is random, being caused by defects and impurities in the semiconductor crystal, the intensity distribution is not. The intensity distribution is non-uniform adjacent the side walls of the detector, due to the presence of a boundary between the semiconductor volume 16 and its surroundings. This is indicated by an illustrative field line 36, illustrated in FIG. 1A.

It is appreciated that in prior art detectors of the type illustrated in FIGS. 1A and 1B, charge carriers tend to collide with the side walls of the detector and be trapped and recombined with carriers of opposite charge. In such cases, the charge carriers do not contribute to the total amount of charge collected by the electrodes 12 and 14 and do not contribute to the signal output of the detector, thus reducing the signal to noise ratio of the detector. The side wall electric field non-uniformity causes the charge collection efficiency to be a function of the impingement location of a photon on the detector, thus reducing the energy resolution of the detector.

Leakage current also reduces the signal to noise ratio and the energy resolution of the detector. The unwanted leakage current has two components, a volume current which depends upon the voltage applied across electrodes 12 and 14 and various properties of the semiconductor substrate 16, and a surface current which passes along the side walls of the detector.

In order to try to overcome problems of insufficient collection efficiency and surface leakage current, a guard ring 50 is provided surrounding anode 12. The guard ring 50 may be active or passive. When passive, it is biased at the same potential as anode 12. When active, an operational amplifier actively maintains the potential difference between the guard ring 50 and the anode 12 at zero.

The guard ring 50 is operative to collect the surface leakage current and prevent its collection by the anode, as well as to improve the uniformity of the electric field in the vicinity of the side walls of the detector. Thus the guard ring 50 improves the signal to noise ratio and the energy resolution of the detector.

A difficulty arises with the use of a guard ring is its required width. A typical minimal width of a guard ring is about 250–300 micrometers for detectors having a thickness of several millimeters. This becomes important in X-ray and gamma ray imaging wherein a detector plane is formed by joining together arrays or matrixes of detectors, as illustrated in FIG. 2.

Figure 2:
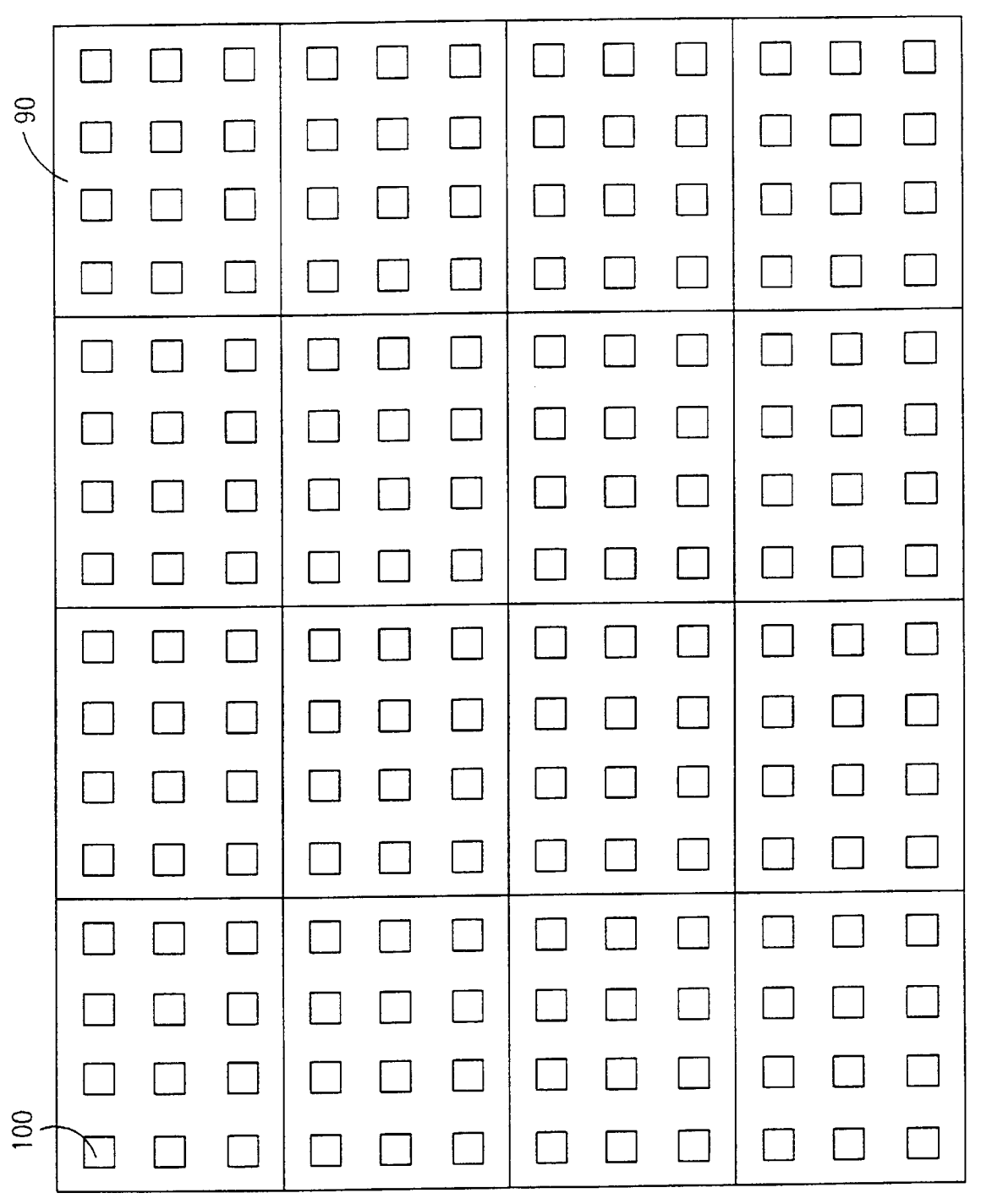

FIG. 2 illustrates part of a typical prior art detector plane including typically 16 matrices 90, each containing 12 detector cells 100. The detector cells which are located along the side walls of the matrices have performance degradation problems similar to those described hereinabove with respect to detectors 10 (FIG. 1).

In view of the discussion of side wall effects hereinabove in connection with FIG. 1, it may be appreciated that of the 12 detector cells in each matrix, 10 suffer from degradation in their performance due to being at the side walls of the matrices. These degraded performance detector cells are moreover arranged in a grid pattern, which pattern appears in the resulting image produced by the detector plane.

The use of a guard ring along the side walls of each matrix 90 may alleviate degradation in performance of the detectors which are along the side walls of the matrices, but gives rise to another problem, requiring minimum spacing between the detector cells in two adjacent matrix to be equal to twice the width of the guard ring, i.e. typically 500 micrometers larger than the spacing between two adjacent detector cells within a given matrix. The resulting non-uniform distribution of detector cells in the detector plane also produces a grid pattern in the resulting image and is therefore objectionable.

Figure 3A:
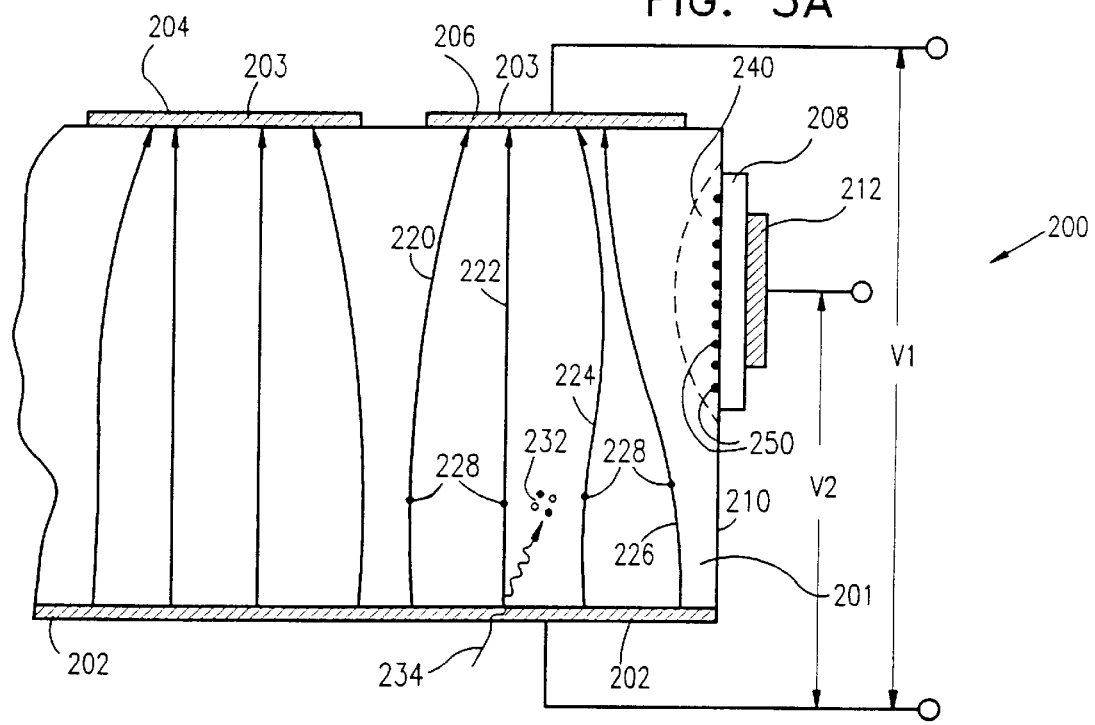
FIGS. 3A and 3B are respective side view and top view simplified illustrations of part of a modular detector array constructed and operative in accordance with a preferred embodiment of the present invention.
Figure 3B:
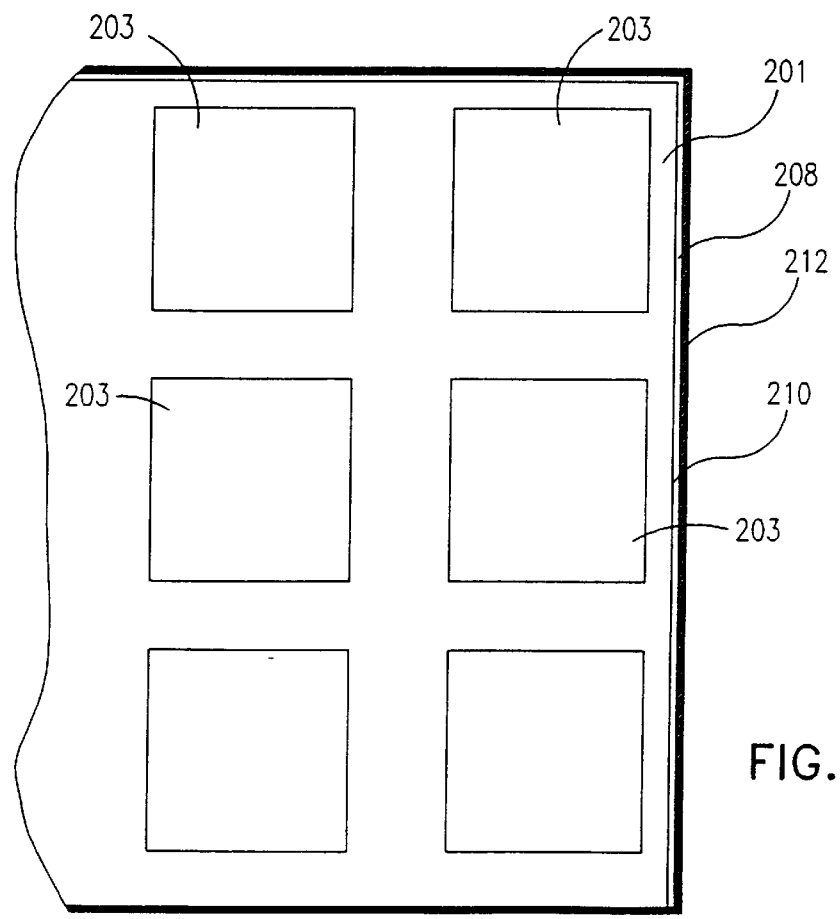

Reference is now made to FIGS. 3A and 3B, which illustrate a portion of a detector plane matrix 200 constructed and operative in accordance with a preferred embodiment of the present invention. The detector plane 200 includes a semiconductor crystal substrate volume 201, a monolithic lower cathode 202 and a plurality of spaced anodes 203, two of which, anodes 204 and 206 are illustrated in FIG. 3A.

In accordance with a preferred embodiment of the present invention an electrical insulating material 208, such as polyimide, is applied to a portion of the peripheral side wall 210 of the matrix 200 as by taping, coating, evaporating, brushing, passivating, oxidating, depositing, bonding, dipping or any other suitable technique. A conductor, defining an electrode 212, typically formed of metal foil, is formed over a part of the insulating material 208, as by taping, painting, coating, printing, evaporating, bonding or any other suitable technique.

The insulating layer 208 and the electrode 212 may be continuous about the periphery of the matrix or formed as a plurality of discrete elements spaced from each other.

In accordance with a preferred embodiment of the present invention, illustrated in FIG. 3A, all of the anodes 203 are maintained at the same electrical potential VI relative to cathode 202. Preferably, electrode 212 is maintained at a potential V2 relative to cathode 202, where V2 is of the same polarity and less than VI. The illustrated embodiment of FIG. 3A is suitable for a detector made of a n-type semiconductor such as CdTe or CdZnTe where electrons have a much higher mobility than that of the holes and the detector is irradiated with photons via the cathode 202. When a p-type semiconductor is employed, the polarities are reversed.

In accordance with a preferred embodiment of the present invention, electrode 212 is floating, is not connected to any power supply and is electrically isolated from all other components of the detector circuit. For safety reasons, anodes 203 are electrically grounded and the entire detector matrix is negatively biased. In this case electrode 212 and anodes 203 have virtually the same potential, but the side wall FET like structure of the invention nevertheless operates properly and produces significant improvements in performance.

In the illustrated embodiment of FIG. 3A, where an n-type semiconductor is employed, typical electron trajectories 220, 222, 224 and 226 are produced by electrons which are drawn from separated charge clouds produced by impingement of multiple photons at various locations in the interior of the detector. It is seen that the trajectories 220–226 are such that the electrons are repelled from the vicinity of electrode 212.

A similar phenomenon occurs for hole trajectories when the polarities are reversed and a p-type semiconductor material is employed.

It is a particular feature of the present invention that electrodes 202, 204 and 212 together with insulating layer 208 on side wall 210 of the matrix 200 define a MIS or MOS FET type structure wherein electrodes 202 and 204 serve as a source and a drain respectively and electrode 212 is equivalent to the gate of the FET. Preferably a FET configuration of this type is applied to all detector cells lying along the side wall 210 of the matrix 200.

In accordance with a preferred embodiment of the present invention as exemplified in the embodiment of FIG. 3A, when electrode 212 is biased positively, it induces an electric field through insulative layer 208 into the semiconductor volume 201. This electric field attracts the electrons from a region 240 adjacent the side wall in semiconductor volume 201 and pulls them toward layer 208. These electrons are schematically illustrated and indicated by reference numeral 250. Electrons 250 produce a space charge at the boundary between insulating layer 208 and the side wall 210, while leaving region 240 in a somewhat electron depleted state.

Electron depleted region 240, due to its low charge carrier concentration has relatively high electrical resistivity. This dramatically reduces the leakage current in region 240 in the vicinity of the side wall 210.

The space charge at the boundary between insulating layer 208 and the side wall 210 produces an electric field that repels electrons and thus bends their trajectories 228 such that their path is shifted away from side wall 210, as illustrated in FIG. 3A. As noted above, a similar phenomenon occurs for hole trajectories when the polarities are reversed and a p-type semiconductor material is employed.

Shifting of the trajectories of the charge carriers away from the region close to the side wall 210 tends to remove them from a problematic region where they would otherwise have a high probability to be trapped and recombined due to the high density of defects in that region. This increases the collection efficiency and uniformity of the detector, inasmuch as the charge carrier trajectories are much the same irrespective of the site 232 at which a photon 234 is absorbed.

It is a particular feature of the present invention that the combined reduction of the leakage current in the vicinity of the side wall and the shifting of the charge carrier trajectories away from the side wall produces a significant improvement in the signal to noise ratio and in the energy resolution of the detector plane.

It is a further particular feature of the present invention that the above mentioned detector performance enhancements may be realized when electrode 212 is biased positively, negative or is ground floated. This is true because the side wall FET structure is not designed to control the channel current for amplification purposes but rather is intended to reduce unwanted side wall effects. It does so for any suitable bias value and polarity of the gate electrode 212.

Figure 4A:
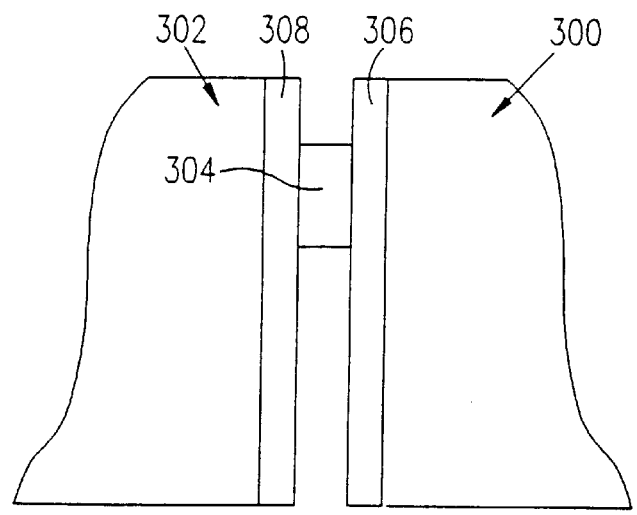
FIG. 4A is a simplified side view illustration of the interface between two adjacent modular detectors having a common gate-like electrode.
Figure 4B:
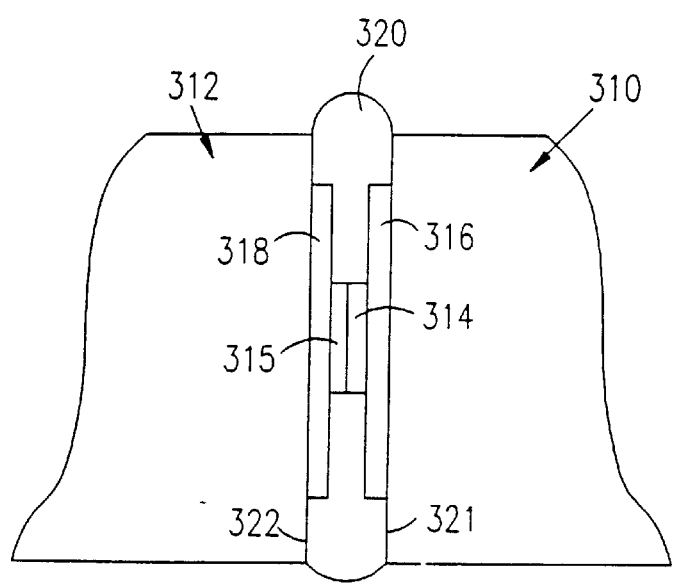
FIG. 4B is a simplified side view illustration of the interface between two adjacent modular detectors having separated gate-like electrodes.

Reference is now made to FIGS. 4A and 4B which illustrate two alternative side wall electrode arrangements useful in accordance with the present invention.

FIG. 4A illustrates one embodiment of attachment between two adjacent modular detector matrices 300 and 302. Here a single gate-like electrode 304 is disposed between two side wall insulating layers 306 and 308 and thus serves both adjacent detectors 300 and 302 in a manner described hereinabove.

FIG. 4B illustrates another embodiment of attachment between two adjacent modular detectors 310 and 312. Here a pair of gate-like electrodes 314 and 315 are provided, each being associated with a corresponding insulating layer 316 and 318. Such a structure may be achieved when insulating layers 316 and 318 are made of double sided sticky tape, such as the tape produced by 3M. One of the sides of the tape is taped to the side walls of the semiconductors and the other side is taped to metal foils which serve as electrodes 314 and 315.

Insulative material 320 may be provided in the interstices between adjacent side walls 321 and 322 of adjacent detector matrices.

Figure 5A:
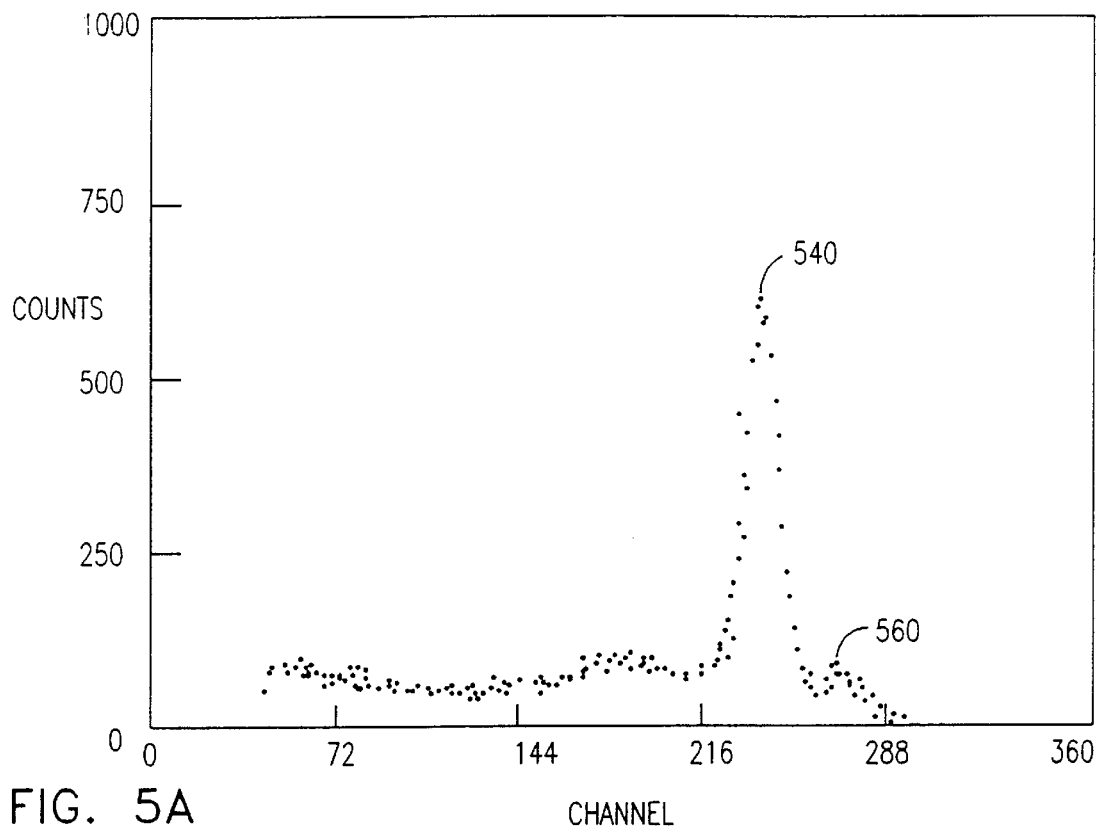
FIGS. 5A and 5B are illustrations of spectra for a detector constructed and operative in accordance with a preferred embodiment of the present invention and for a prior art detector, respectively.
Figure 5B:
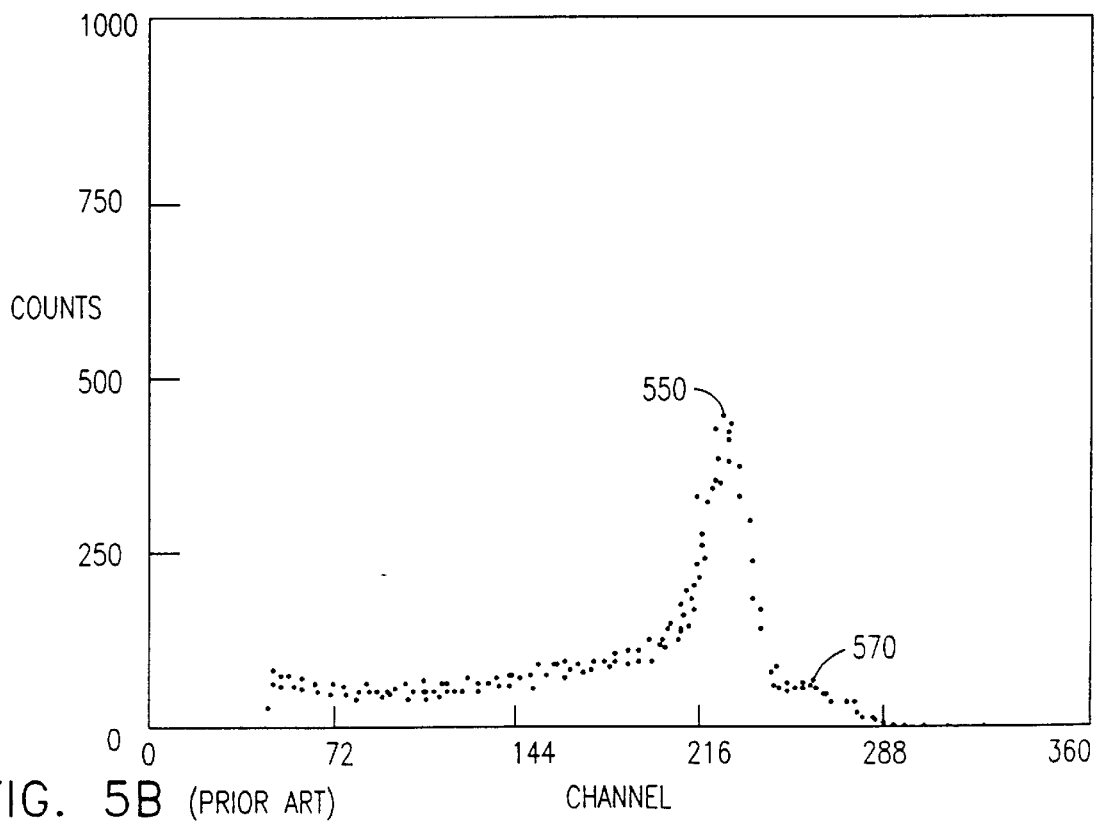

Reference is now made to FIGS. 5A and 5B which show pulse height spectra for a CdZnTe detector cell for $_{27}Co^{57}$ (122KeV—87% and 136KeV –9% gamma ray radiation). The detector is a corner detector cell in a matrix having two side walls. FIG. 5A shows the spectrum for a configuration wherein the cell is provided with a gate like electrode such as electrode 212 along its two side walls and FIG. 5B shows the spectrum for a configuration wherein the cell is not provided with such an electrode.

The following parameters are compared in the spectra of FIGS. 5A and 5B:

location of the peaks (channel number)

width of the peaks;

number of counts in the peaks;

the peak to valley ratio; and the spectrum resolution.

It is seen that in FIG. 5A, the peaks, indicated by reference numerals 540 and 560 are located at high channel numbers are narrow, have a greater number of counts, have a higher peak to valley ratio and better resolution than the corresponding peaks 550 and 570 in FIG. 5B.

This comparison clearly indicates that the provision of gate like electrodes in accordance with the present invention results in a detector having enhanced collection efficiency, an improved signal to noise ratio, a collection efficiency that is less dependent on the absorption location of photons and a lower leakage current. The resulting detector has performance enhanced a level which is generally indistinguishable from that of a detector having no side walls.

It will be appreciated by persons skilled in the art that the present invention is not limited by what has been particularly shown and described hereinabove. Rather the scope of the present invention is defined only by the claims which follow:

We claim:

1. A semiconductor detector comprising:

a substrate formed of a semiconductor material and defining two opposite facing surfaces and at least one side wall;

electrodes formed on two opposite facing surfaces of the substrate;

an electrical insulator formed on at least part of said at least one side wall; and an electrical conductor formed over at least part of said electrical insulator, wherein said electrodes, said electrical insulator and said conductor operate generally in the manner of a field-effect transistor.

2. Apparatus according to claim 1 wherein said electrical conductor is floating and is electrically isolated from said substrate and said electrodes.

3. Apparatus according to claim 1 wherein said electrical conductor, for any bias value and polarity thereof, induces an electric field through said electrical insulator into said semiconductor material, thereby pulling electrons from a region adjacent said at least one side wall towards said electrical insulator, and producing a space charge at a boundary between said electrical insulator and said at least one side wall, said space charge shifting trajectories of charge carriers away from said region adjacent said at least one side wall.

4. Apparatus according to claim 1 and further comprising at least one anode and at least one cathode, wherein said electrical conductor is substantially maintained at a potential relative to said at least one cathode, said potential being of the same polarity and less than an electrical potential substantially maintained between at said at least one anode and said at least one cathode.

5. Apparatus according to claim 1 wherein said electrical conductor is grounded.

6. An array of modular semiconductor detector assemblies, each detector assembly including:
   a substrate formed of a semiconductor material and defining two opposite facing surfaces; and
   electrodes formed on two opposite facing surfaces of the substrate;
   at least some of said modular detector assemblies defining at least one side wall at an edge of said array and including:
      an electrical insulator formed on at least part of said at least one side wall; and
      an electrical conductor formed over at least part of said electrical insulator, wherein said electrodes, said electrical insulator and said conductor operate generally in the manner of a field-effect transistor.

7. A detector plane comprising a plurality of adjacent detector arrays according to claim 6 and wherein peripheral side walls of adjacent detector assemblies have a common conductor functioning as a FET gate electrode.

8. A detector plane comprising a plurality of adjacent detector arrays according to claim 6 and wherein peripheral side walls of adjacent detector assemblies have separate conductors each functioning as a FET gate electrode.

9. Apparatus according to claim 6 wherein said electrical conductor is floating and is electrically isolated from said substrate and said electrodes.

10. Apparatus according to claim 6 wherein said electrical conductor, for any bias value and polarity thereof, induces an electric field through said electrical insulator into said semiconductor material, thereby pulling electrons from a region adjacent said at least one side wall towards said electrical insulator, and producing a space charge at a boundary between said electrical insulator and said at least one side wall, said space charge shifting trajectories of charge carriers away from said region adjacent said at least one side wall.

11. Apparatus according to claim 6 and further comprising at least one anode and at least one cathode, wherein said electrical conductor is substantially maintained at a potential relative to said at least one cathode, said potential being of the same polarity and less than an electrical potential substantially maintained between at said at least one anode and said at least one cathode.

12. Apparatus according to claim 6 wherein said electrical conductor is grounded.

13. A method for overcoming performance degradation in a semiconductor detector due to non-uniformities in an electric field adjacent a side wall, the detector comprising a substrate formed of a semiconductor material and defining two opposite facing surfaces and at least one side wall, and also comprising electrodes formed on two opposite facing surfaces of the substrate, the method comprising the steps of:
   forming an electrical insulator on at least part of said at least one side wall; and
   forming an electrical conductor over at least part of said electrical insulator, wherein said electrodes, said electrical insulator and said conductor operate generally in the manner of a field-effect transistor.

14. A method according to claim 13 and comprising the step of inducing an electric field through said electrical insulator into said semiconductor material, thereby pulling electrons from a region adjacent said at least one side wall towards said electrical insulator, and producing a space charge at a boundary between said electrical insulator and said at least one side wall, said space charge shifting trajectories of charge carriers away from said region adjacent said at least one side wall.

* * * * *